United States Patent [19]
Narita et al.

[11] Patent Number: 4,737,378

[45] Date of Patent: Apr. 12, 1988

[54] ROLL COATER CONTROL METHOD AND ROLL COATER

[75] Inventors: Katsunaga Narita; Eiichiro Hayashi, both of Hikone, Japan

[73] Assignee: Dainippon Screen Mfg. Co., Ltd., Kyoto, Japan

[21] Appl. No.: 20,731

[22] Filed: Mar. 2, 1987

[30] Foreign Application Priority Data

Mar. 1, 1986 [JP] Japan ................................. 61-044743

[51] Int. Cl.$^4$ .......................... B41F 31/00; B05C 1/06; B05C 1/08; B05C 11/00
[52] U.S. Cl. ......................................... 427/8; 101/350; 118/247; 118/249; 118/262; 118/663; 118/712
[58] Field of Search ............... 101/207, 208, 350, 363; 118/247, 249, 262, 663, 696, 704, 712; 427/8

[56] References Cited
U.S. PATENT DOCUMENTS 4,269,140  5/1981  Burns et al. ..................... 118/249 X
4,495,886  1/1985  Phelps .............................. 118/249

Primary Examiner—Michael R. Lusignan
Attorney, Agent, or Firm—Lowe, Price, LeBlanc, Becker & Shur

[57] ABSTRACT

Prior to starting, the size of a clearance, defined on a second end side of a roll when an end of a coating roll is brought into contact with a first end side of a doctor or back-up roll, is measured and stored as data in a memory. After starting, the amounts of movement of both ends of the rolls are controlled in driving of the doctor or back-up roll to be in contact with/separated from the coating roll so that the second end side of the roll is moved by a distance larger by the clearance size than the first end side of the roll on the basis of the clearance size data. Thus, the clearance size is corrected so that the outer peripheral surfaces of the rolls driven to be in contact with/separated from each other are continuously retained parallel in arbitrary moving positions.

4 Claims, 11 Drawing Sheets

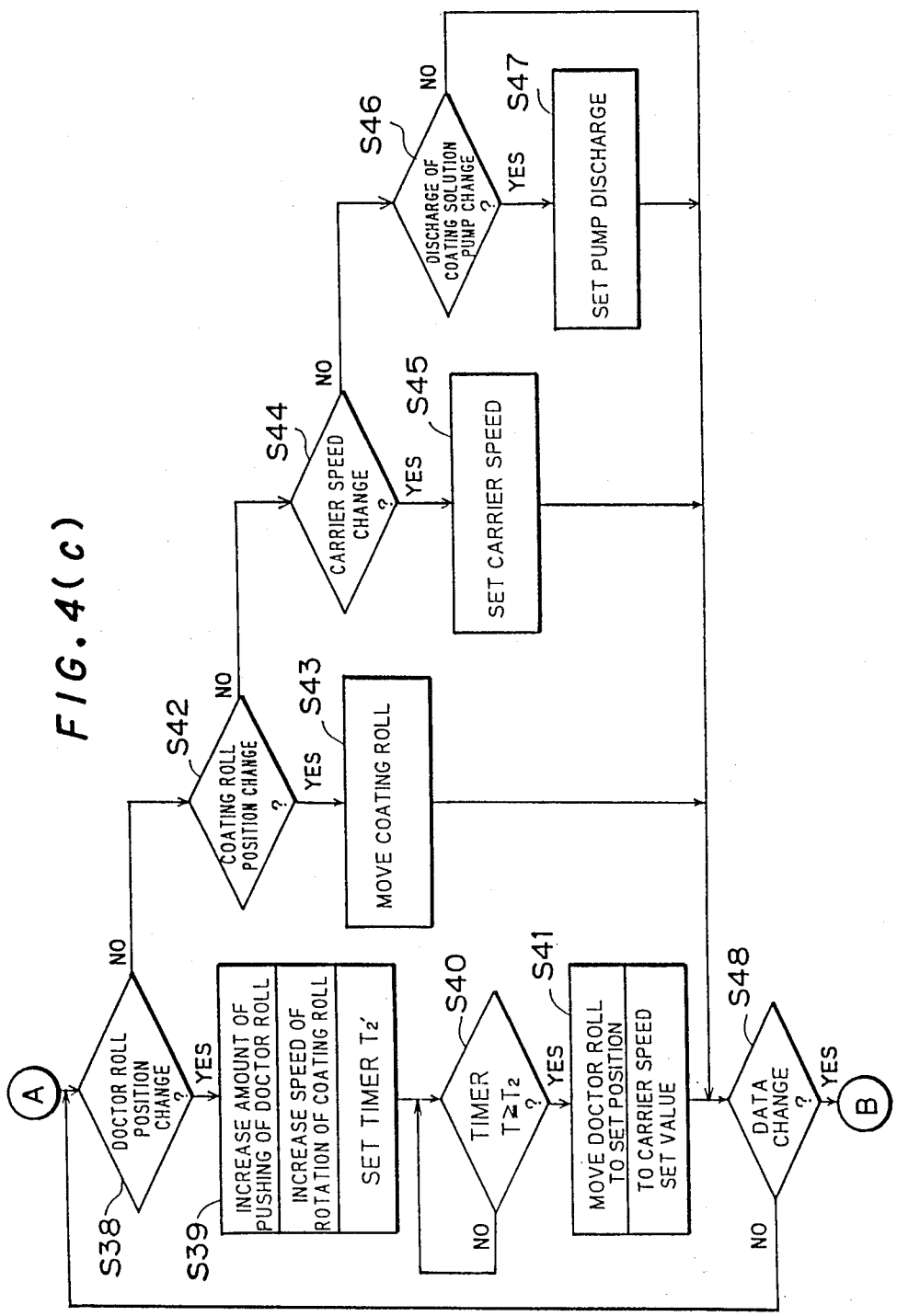

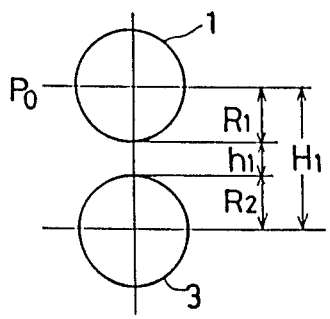
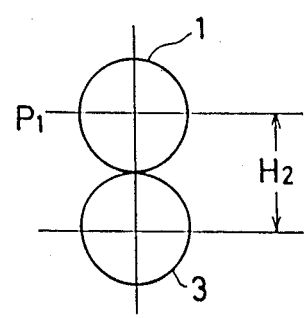
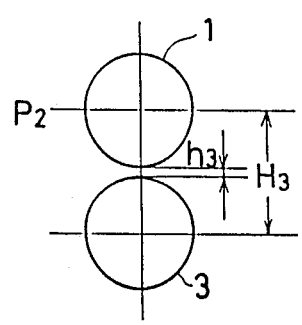
FIG. 6(a)    FIG. 6(b)    FIG. 6(c)
$H_1 = R_1 + R_2 + h_1$    $H_2 = R_1 + R_2$    $H_3 = R_1 + R_2 + h_3$
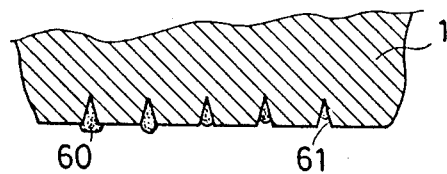
FIG. 9

ROLL COATER CONTROL METHOD AND ROLL COATER

BACKGROUND OF THE INVENTION

1. Field of the Invention

The present invention relates to a roll coater control method and a roll coater for coating a required coating solution such as a photoresist solution in a uniform thickness on the surface of a substrate such as that of glass, ceramic or silicon.

2. Description of the Prior Art

FIG. 10 shows a conventional roll coater well known as an apparatus for coating a photoresist solution on the surface of a substrate of glass, ceramic or silicon. This roll coater retains a coating roll 1 to be rotatable about a horizontal axis through a bearing 1a while retaining the bearing 1a vertically movable through cylinders 6 so that the coating roll 1 can be in contact with/separated from a back-up roll 3. A pair of such cylinders 6 are provided in correspondence to both ends of the coating roll 1, to independently drive the ends of the coating roll 1 to be in contact with/separated from the back-up roll 3. A doctor roll 2 is retained to be rotatable about a horizontal axis through a bearing 2a, which is reciprocably retained by cylinders 7 so that the doctor roll 2 can be in contact with/separated from the coating roll 1. A pair of such cylinders 7 are provided in correspondence to both ends of the doctor roll 2, to independently drive the said ends of the doctor roll 2 to be in contact with/separated from the coating roll 1.

A coating operation is performed by rotating the respective rolls 1, 2 and 3 in the directions indicated by arrows while locating the same in positions as shown in FIG. 10. The a coating solution 60 is supplied between the rolls 1 and 2 from a nozzle 5, and a substrate 10 is fed between the rolls 1 and 3 by a carrier roll 4. Thus, the coating solution 60 supplied from the nozzle 5 is coated on the surface of the substrate 10 through the coating roll 1.

FIG. 11 is a schematic view showing another example of a conventional roll coater. This roll coater is different from that shown in FIG. 10 merely in that a doctor bar 8 as shown in FIG. 11 is employed in place of the doctor roll 2 as shown in FIG. 10.

In each of the conventional roll coaters, the pressure applied to both end shafts of the coating roll 1 can be adjusted through the cylinders 6 and a vertical movement adjusting screw (not shown) in order to uniformly adjust the film thickness of the coating solution coated on the surface of the substrate 10. However, it is difficult to finely adjust the amount of vertical movement of the coating roll 1 by the cylinders 6. Thus, when the board thickness of the substrate 10 is varied, the coating solution cannot be adjusted to be in the prescribed thickness in response to the varied board thickness of the substrate 10.

In each of the said roll coaters, the volume of the coating solution coated on the surface of the coating roll 1, i.e., the film thickness of the coating solution, can be adjusted by controlling the amount of pushing of the doctor roll 2 or the doctor bar 8 against the coating roll 1, i.e., the amount of pressure applied from the cylinders 7 to the doctor roll 2 or the doctor bar 8. Also in this case, however, it is difficult to finely adjust the amount of reciprocation of the doctor roll 2 or the doctor bar 8 by the cylinders 7, whereby the film thickness of the coating solution applied to the surface of the coating roll 1 cannot be adjusted. In this case, it is possible to finely adjust the pressure applied to the doctor roll 2 or the doctor bar 8 by the cylinders 7 manually through a distance adjusting bolt (not shown). In that case, however it is impossible to automatically adjust the film thickness.

In order to automatically adjust the film thickness, the following structure may be employed in place of the cylinders 6 and 7 in each of the aforementioned roll coaters. Namely, pulse motors and screw rods rotatably driven by the pulse motors may be employed so that the screw rods are respectively engaged with the bearings 1a on both ends of the coating roll 1 and the bearings 2a on both ends of the doctor roll 2. Then the pulse motors are adapted to adjust the vertical movement of the coating roll 1 and the reciprocation of the doctor roll 2. However, such structure causes the following new problems. In general, errors in working accuracy on the surfaces of the rolls 1 and 2 may cause one end of such a roll to be different in diameter from the other end. Further, the amount of movement at one end of the roll may not correspond to that at the other end due to tolerance between the screw rods and the bearings 1a and 2a or to screw working errors of the screw rods. Thus, when the rolls 1 and 2 are driven to be in contact with/separated from each other, outer peripheral surfaces of the opposing rolls 1 and 3 or 1 and 2 may not be parallel with each other, whereby the coating film formed on the surface of the substrate 10 is nonuniform in thickness.

SUMMARY OF THE INVENTION

The present invention is directed to a method of controlling a roll coater for coating a required coating solution to a uniform thickness on the surface of a substrate. The invention is also directed to a roll coater structure capable of implementing the method.

The roll coater control method according to the present invention includes a step of relatively driving a doctor or backup roll to be close to a coating roll and controlling an end of the coating roll to be in contact with an end of the doctor or back-up roll to measure the size of a clearance defined between the other ends of the rolls; a step of storing data on the measured clearance size in a memory; and a step of controlling the amount of relative driven movement of the doctor or back-up roll to be in contact with/separated from the coating roll so that the other end of the roll is moved by a distance larger by the clearance size than the one end of the roll on the basis of the clearance size data stored in the memory.

The roll coater according to the present invention comprises a contact/separation driving means for relatively driving a doctor roll and a back-up roll to be in contact with/separated from a coating roll, a movement amount detecting means for separately detecting amounts of relative movement between both ends of the coating roll and both ends of the doctor or back-up roll, a memory means for storing data on the size of a clearance defined on the other end side of the rolls when one end of the coating roll is brought into contact with one end of the doctor or back-up roll and a control means for controlling the amount of relative driven movement of the doctor or back-up roll to be in contact with/separated from the coating roll through the contact/separation driving means so that the other end thereof is moved by a distance larger by the clearance size than one end of the roll in the contact direction on the basis of the clearance size data stored in the memory means.

Accordingly, a principal object of the present invention is to provide a roll coater control method and a roll coater which can form a coating solution of uniform thickness on the surface of a substrate and which can automate fine adjustment of the film thickness.

According to the present invention, the size of a clearance, defined on a second end of a roll upon making one end of a coating roll contact an end of a doctor or back-up roll, is measured in advance to starting and the data thereof is stored in a memory means. The clearance is defined due to working errors in the surfaces of the rolls or to difference in amounts of feed of both ends of the rolls by contact/separation means. After starting, the amounts of movement of both ends of the rolls are controlled in driving the doctor or back-up roll to be in contact with/separated from the coating roll so that the second end of the roll is moved by a distance larger by the clearance size than the one end of the roll on the basis of the clearance size data. Thus, the clearance size is so corrected that the outer peripheral surfaces of the rolls being brought into contact with/separated from each other are continuously retained parallel in arbitrary moving positions.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6(a), (b) and (c) are explanatory diagrams for illustrating operation of the coating roll;

FIG. 9 is a partially enlarged sectional view of the coating roll;

DESCRIPTION OF THE PREFERRED EMBODIMENT

Figure 1:
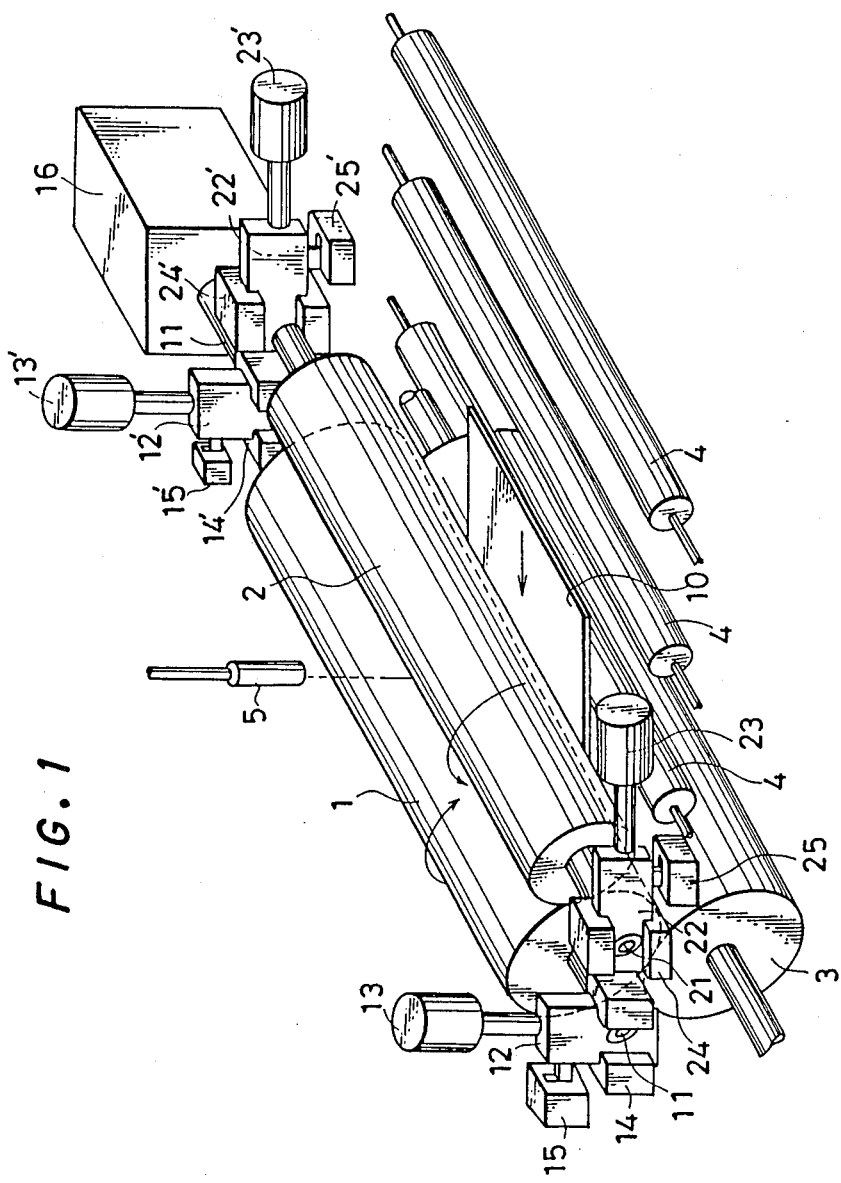
FIG. 1 is a schematic perspective view of a roll coater to which the present invention is applied.
Figure 2:
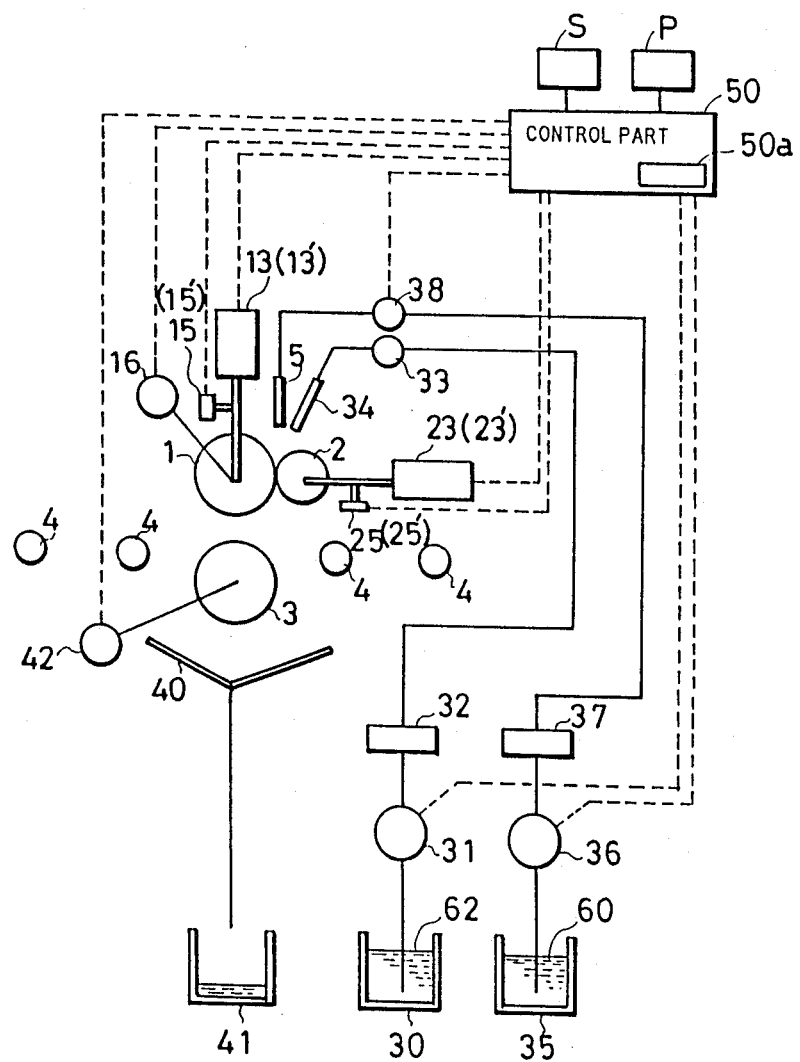
FIG. 2 is a schematic diagram showing the roll coater.

FIG. 1 is a schematic perspective view of a roll coater to which the present invention is applied, and FIG. 2 is a schematic diagram thereof.

As shown in FIGS. 1 and 2, the roll coater comprises a coating roll 1 having a roll shaft 11 whose two ends are rotatably supported by sliders 12 and 12', which in turn are vertically movably retained by guides 14 and 14' fixedly provided on a body case (not shown). Vertical movement of the sliders 12 and 12' is driven by driving means 13 and 13' formed by pulse motors or the like. Vertical positions of the sliders 12 and 12', varied by movement thereof, are detected by vertical movement position detecting means (movement amount detecting means) 15 and 15' formed by linear encoders or the like, whose detecting signals are inputted to a control part 50 (FIG. 2). In this case, the pair of guides 14 and 14', the pair of sliders 12 and 12', the pair of driving means 13 and 13' and the pair of vertical movement position detecting means 15 and 15' form contact/separation driving means.

A doctor roll 2 has a roll shaft 21 whose two ends are rotatably supported by sliders 22 and 22', which in turn are retained by guides 24 and 24' fixedly provided on the body case (not shown) to be reciprocable toward the coating roll 1. Reciprocation of the sliders 22 and 22' is driven by driving means 23 and 23' formed by pulse motors or the like. Positions of the sliders 22 and 22', varied by reciprocation thereof, are detected by reciprocation position detecting means (movement amount detecting means) 25 and 25' formed by linear encoders or the like, whose detecting signals are inputted to the control part 50 (FIG. 2). The doctor roll 2 may be replaced by a doctor bar.

It is preferable that the coating roll 1 is structured to move vertically with the doctor roll 2 and the reciprocation driving means (contact/separation means, i.e. the pair of guides 24 and 24', the pair of sliders 22 and 22', the pair of driving means 23 and 23', and the pair of reciprocation position detecting menas 25 and 25'). Coating roll 1 may be structured to move independently itself.

A back-up roll 3 is arranged in a prescribed position under the coating roll 1. Carrier rolls 4 are arranged longitudinally along the back-up roll 3.

Rotation of the coating roll 1 is caused by a rotation driving means 16, and the rotation of the back-up roll 3 and the carrier rolls 4 is caused by a rotation driving means 42 (see FIG. 2). The back-up roll 3 and the carrier rolls 4 may alternatively be driven by the rotation driving means 16 for the coating roll 1.

A nozzle 5 for a coating solution and a nozzle 34 (FIG. 2) for a detergent solution, if necessary, are arranged above the contact portion between the coating roll 1 and the doctor roll 2. The nozzles 5 and 34 are suspended to be reciprocable along the longitudinal direction of the rolls 1 and 2 (which direction is perpendicular to FIG. 2). As shown in FIG. 2, a required coating solution 60 is supplied from a vessel 35 through a pump 36 to the nozzle 5 through a filter 37 and a flow sensor 38. A detergent solution 62 is supplied from a vessel 30 through a pump 31 to the nozzle 34 through a filter 32 and a flow sensor 33.

An automatic three-way valve may be provided in the outlet or inlet side of a pump to provide a single piping system for both the coating solution and the detergent solution.

A drainage receiving tray 40 is provided under the back-up roll 3, so that drainage of the coating solution 60 and the detergent solution 62 received therein is collected in a vessel 41.

Figure 3:
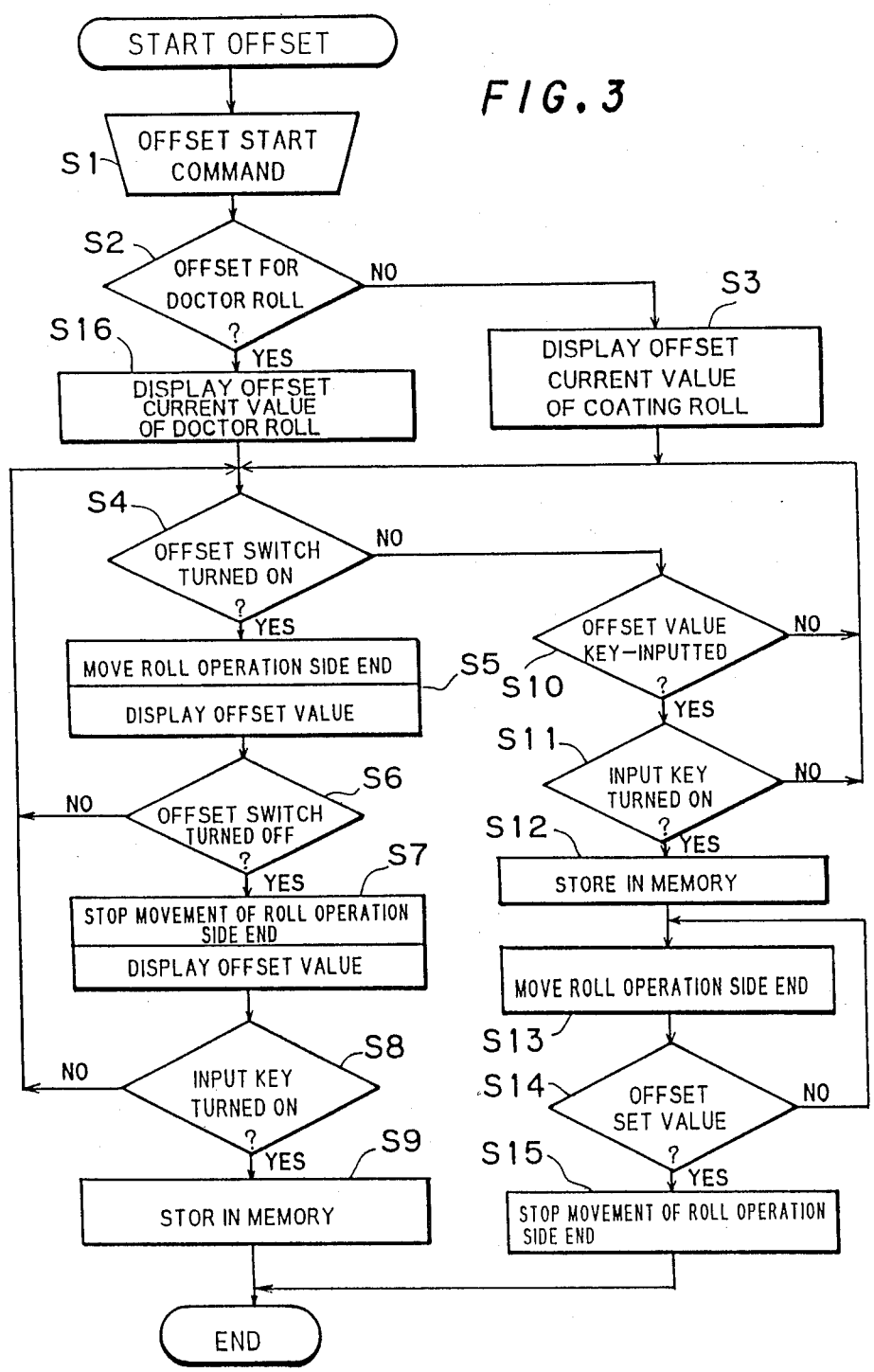
FIG. 3 is a flow chart showing offset setting procedures of the roll coater.
Figure 4A:
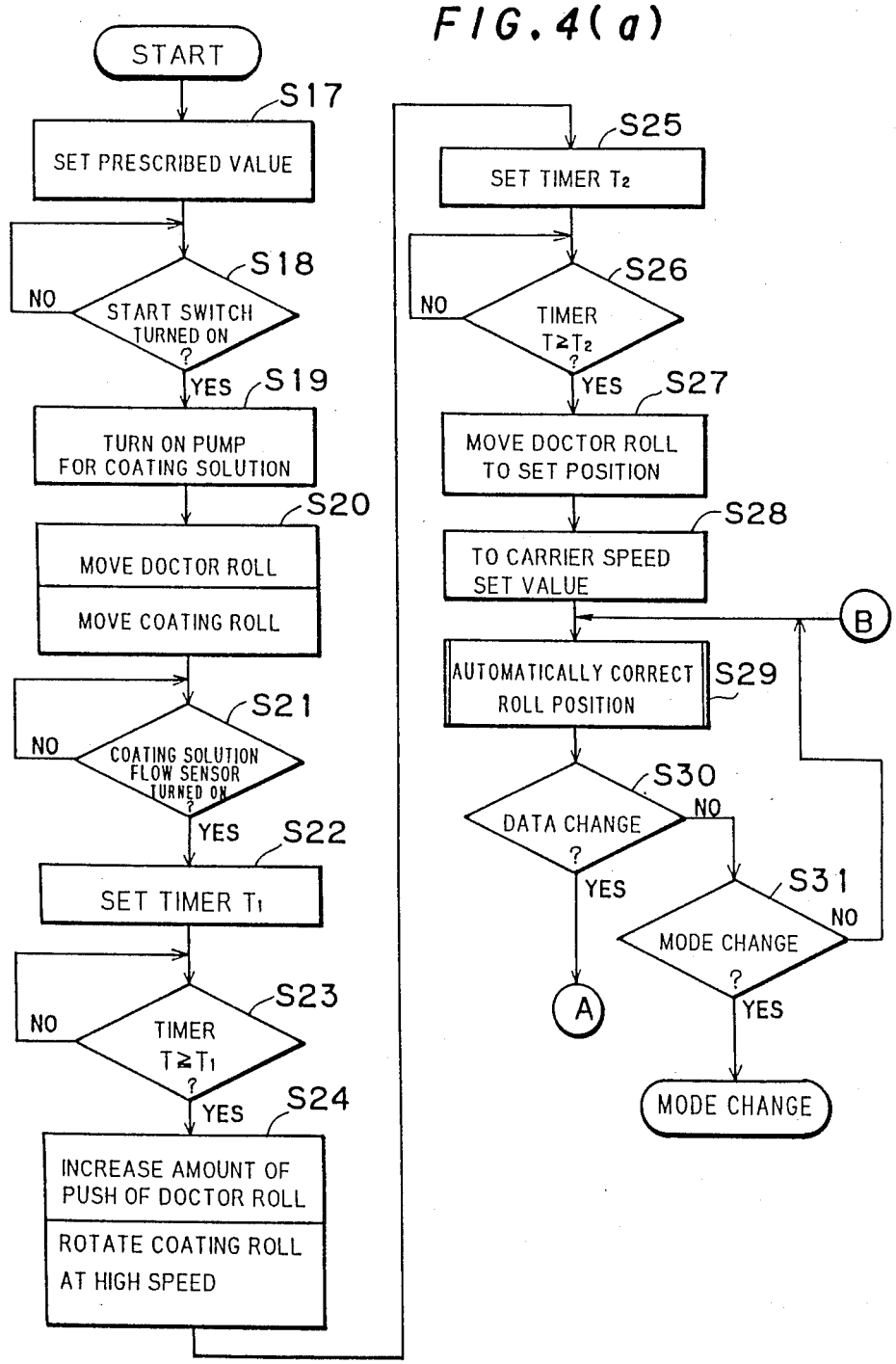
FIGS. 4(a), (b) and (c) are flow charts showing starting and data changing procedures of the roll coater.
Figure 4B:
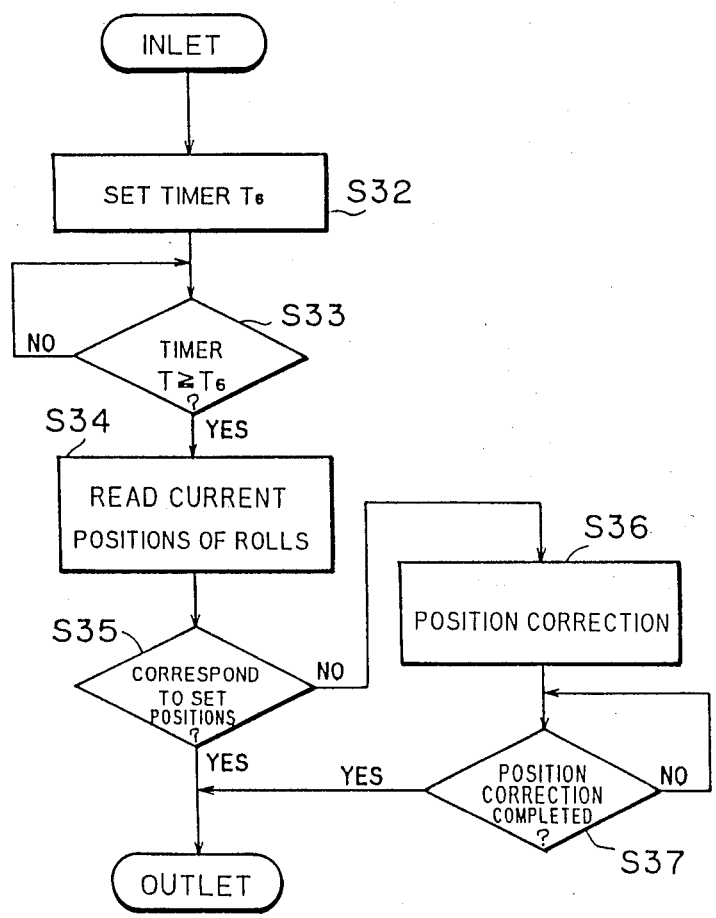
Figure 5:
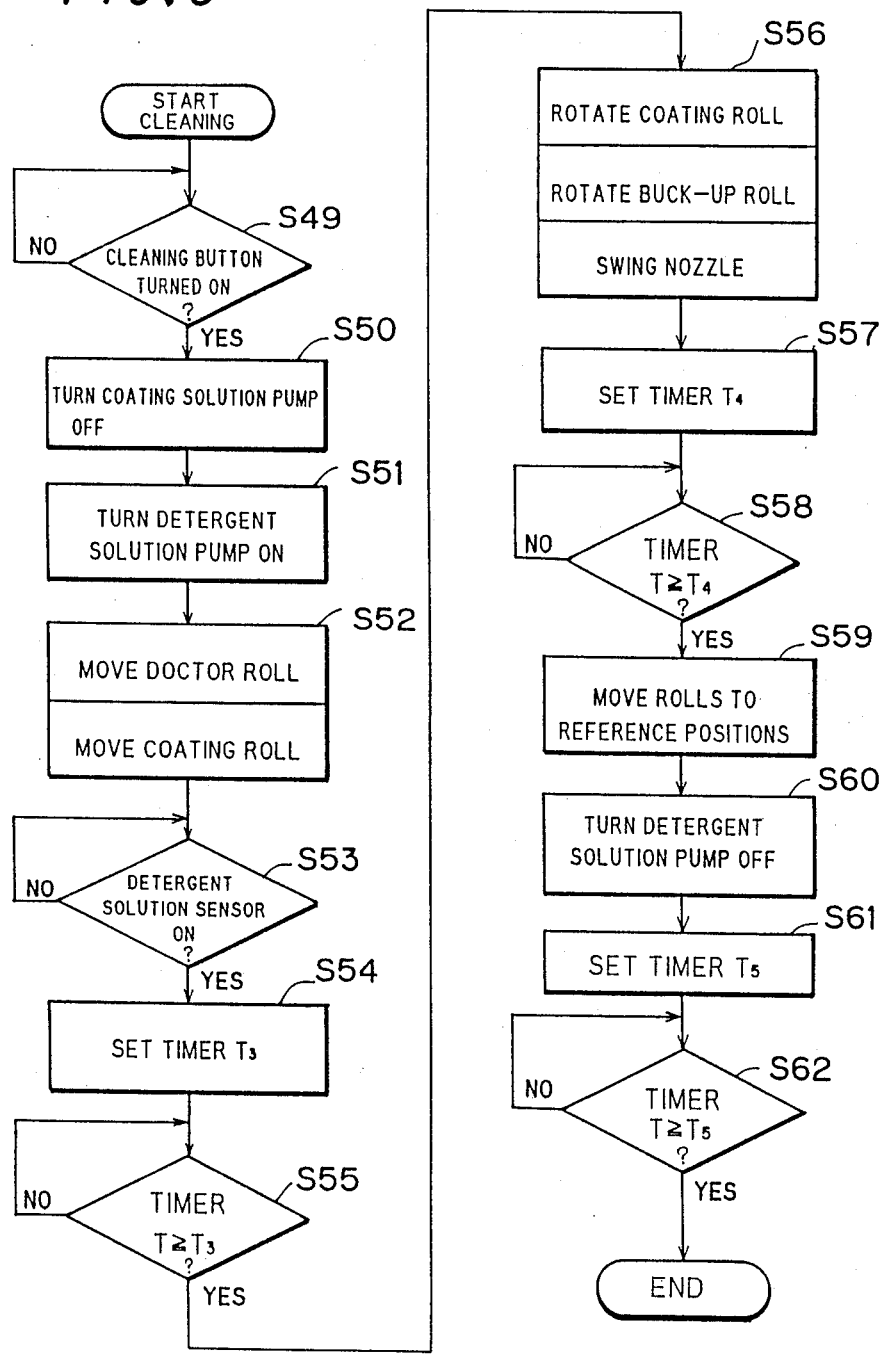
FIG. 5 is a flow chart showing cleaning procedures of the roll coater.

The operation of the aforementioned roll coater is now described with reference to flow charts as shown in FIGS. 3 to 5.

(1) Offset Setting

In advance to starting of the roll coater, an offset setting is performed, as will be clearly understood from the following description.

As shown in FIG. 6(a), the coating roll 1 located at a reference position $P_0$ is moved downwardly by a prescribed distance $h_1$ to a position $P_1$ to be in contact with the back-up roll 3 as shown in FIG. 6(b), whereby the interaxial distance between the rolls 1 and 3 is changed from $H_1$ to $H_2$.

Figure 7A:
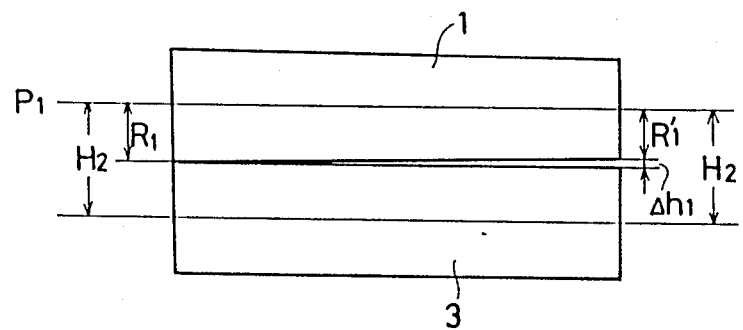
FIGS. 7(a) and (b) illustrate the reason why a clearance is defined between rolls.
Figure 7B:
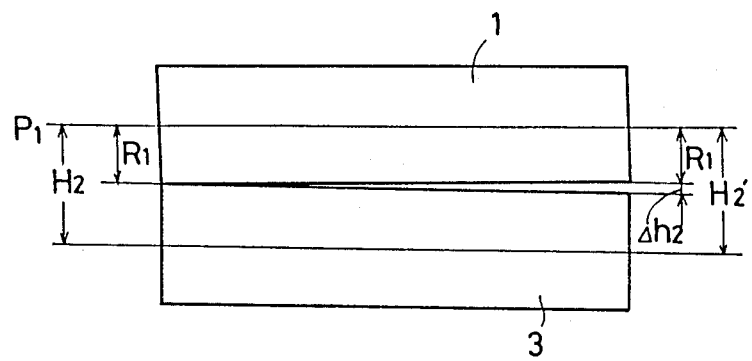

FIGS. 7(a) and 7(b) illustrate typical positional relations between the rolls 1 and 3 which are viewed in a front elevational manner in FIG. 6(b), i.e., from the left-hand direction of FIG. 6. Namely, FIG. 7(a) shows a case where the interaxial distance $H_2$ between the coating roll 1 and the back-up roll 3 is identical in left and right ends, while the left-side radius $R_1$ and the right-side radius $R_1'$ are in a relation of $R_1 > R_1'$ due to a surface working error in the coating roll 1. In this case, a clearance in the size of $\Delta h_1$ is defined between the right end portions of the coating roll 1 and the back-up roll 3. The size $\Delta h_1$ of the clearance is smaller than 100 μm in general, while the coating solution coated on the surface of the substrate 10 is nonuniform in film thickness when the roll coater is started with such a clearance being defined.

In the case of FIG. 7(b), the interaxial distances are different at the two ends of the rolls, even though the surface working accuracy is uniform for both ends of the coating roll 1. Namely, the interaxial distance $H_2'$ on the right-hand side is larger by $\Delta h_2$ than the interaxial distance $H_2$ on the left-hand side. This difference is caused by downward movement of the coating roll 1 from the position $P_0$ to the position $P_1$ in FIG. 6 due to a working error in the coating roll vertical movement driving means. Also in this case, a clearance of a size $\Delta h_2$ is defined between the right-end portions of the coating roll 1 and the back-up roll 3, whereby the coating solution coated on the surface of the substrate 10 is nonuniform in film thickness when the roll coater is started in this state.

Therefore, the said size $\Delta h_1$ or $\Delta h_2$ of the clearance is observed as offset correction data, and only the right-end portion of the coating roll 1 is downwardly moved from the state as shown in FIG. 7(a) or 7(b) until the clearance is filled, to obtain the size of $\Delta h_1$ or $\Delta h_2$ from the amount of the downward movement. Then the obtained size is stored in a memory (storage means) 50a in the control part 50 of FIG. 2 (such operation is hereinafter referred to as offset operation).

The procedures of such offset operation are now described in detail with reference to the flow chart as shown in FIG. 3. First, an operator operates an operation panel S (FIG. 2) to input an offset start command for the coating roll in the control part 50 (step S1). Upon input of the offset start command, the process is advanced to a step S2, to make a determination as to offset of the doctor roll. Since the offset command for the coating roll is inputted, the determination at the step S2 is NO. Then the process is advanced to a step S3, whereby the coating roll 1 is moved from the reference position $P_0$ of FIG. 6(a) to the position $P_1$ of FIG. 6(b). Then the control part 50 performs an arithmetic operation on the amount of movement of the coating roll 1 and obtains the difference between the two ends of the coating roll 1 on the basis of the detecting signals from the movement position detecting means 15 and 15' (FIGS. 1 and 2), to sequentially display the same on a display panel P (FIG. 2) as offset current values. Thus, upon completion of movement to the position $P_1$ as shown in FIG. 6(b), zero is displayed as the difference in movement amounts for the case of FIG. 7(a) since the movement amounts $H_2$ are identical for both ends, while the difference $\Delta h_2$ in movement amounts is displayed in the case of FIG. 7(b).

When an offset switch provided on the operation panel S is turned on (step S4), an operation is performed wherein the operation side end portion of the coating roll 1 (the right-end portion of the coating roll 1 in FIG. 7) is moved downwardly by the vertical movement driving means 13' (FIG. 1), so that the amount of this movement is displayed on the display panel P (step S5). When the display value reaches the previously observed clearance size $\Delta h_1$ or $\Delta h_2$ in the case of FIG. 7(a) or 7(b) for example, or when it is visually confirmed that the clearance between the right end portions of the rolls 1 and 3 is filled, the operator turns off the aforementioned offset switch to stop the downward movement of the operation side end portion of the coating roll 1 (steps S6 and S7). The amount of movement currently displayed on the display panel, i.e., the offset value is stored in the memory 50a through operation of an input key on the operation panel S (steps S8 and S9). When a clearance is defined between the left end portions of the rolls 1 and 3, the opposite of what is shown in FIG. 7(a) or 7(b), an antioperation side end portion of the coating roll 1 is moved downwardly to a position where the clearance between the left end portions is filled, or the operation side end portion of the coating roll 1 is moved upwardly to a position where the coating roll 1 is parallel with the back-up roll 3. Then the amount of such movement of the roll end portion is read from the display panel P to be stored in the memory 50a.

In the situation illustrated in FIG. 7(b), the difference $\Delta h_2$ between the amounts of movement of the two end portions of the coating roll 1 is displayed on the display panel P at the step S3, and hence the offset value can be set by moving the operation side end portion of the coating roll 1 downwardly until the display value reaches $\Delta h_2$ in the display at the step S5.

When the size of the clearance in the operation side end portion of the coating roll 1 ($\Delta h_1$ or $\Delta h_2$ in the case of FIG. 7(a) or 7(b)) is already known by previous observation, the offset setting may be performed in the following manner: The offset switch is turned off at the step S4. Then the clearance size (offset value) is directly key-inputted from the operation panel S at a step S10, and the input key is on-operated to an on condition at a step S11 to store the value in the memory 50a. In this case, the offset value is stored in the memory 50a at a step S12, whereafter the operation side end portion of the coating roll 1 is moved downwardly by the amount corresponding to the offset value stored in the memory 50a and is stopped as shown at steps S13 to S15. Thus, whether or not the offset value is correctly set can be confirmed by observing whether or not the clearance between the rolls is filled after stoppage of the downward movement.

Figure 8A:
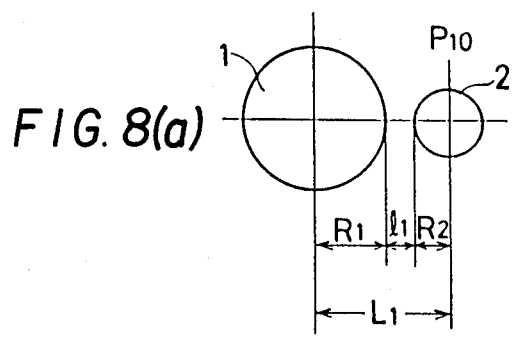
FIGS. 8(a) to (d) are explanatory diagrams for illustrating operation of a doctor roll.
Figure 8B:
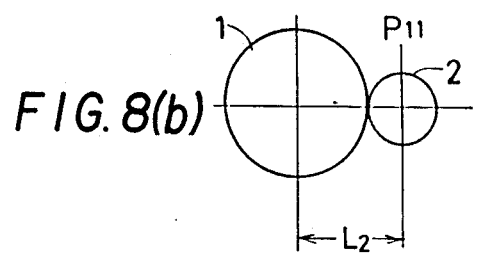

While the offset operation for the coating roll 1 has been described, an offset operation for the doctor roll 2 is performed through substantially similar procedures. When the doctor roll 2 is located in a reference position $P_{10}$ as shown in FIG. 8(a) and is moved by a prescribed distance $l_1$ to a position $P_{11}$ to be in contact with the coating roll 1 as shown in FIG. 8(b), a clearance $l_1$ is defined between left or right end portions of the rolls 1 and 2 due to working errors in the rolls 1 and 2, in the reciprocation driving means, or the like. Therefore, it is necessary to set the clearance size as an offset value, and the operation for setting the same is performed substantially in a similar manner to the offset operation hereinabove described for the coating roll 1. Namely, when an offset start command for the doctor roll is inputted at the step S1, the process is advanced from the step S2 to a step S16, to display the offset current value of the doctor roll 2 on the display panel P. Thereafter the process is advanced to the step S4, so that the offset value for the doctor roll 2 can be set through procedures similar to those in the case of the coating roll 1 by the respective steps thereafter.

(2) Starting of Roll Coater

Upon completion of the offset operation, the roll coater is started. FIG. 4(a) is a flow chart showing the operation for starting the roll coater.

At a step S17, data required for starting the roll coater are inputted to the control part 50 (FIG. 2). For example, prescribed movement distances of the coating roll 1 in coating and cleaning, prescribed distances of movement of the doctor roll 2 in pushing, coating and cleaning and the speeds of rotation of the rolls 1, 2 and 3 in high-speed rotation and normal rotation and the like are inputted at this step. At this point of time, the respective rolls 1, 2 and 3 are located in the reference positions as shown in FIGS. 6(a) and 8(a).

Then, at a step S18, a starting button switch provided on the operation panel S is turned on. The pump 36 for the coating solution is then turned on at a step S19, whereby the required coating solution 60 is supplied from the vessel 35 to the nozzle 5 through the filter 37.

Then, at a step S20, the doctor roll 2 is moved from the reference position $P_{10}$ as shown in FIG. 8(a) to the position $P_{11}$ to be in contact with the coating roll 1 as shown in FIG. 8(b). In this case, the amount of movement of the operation side end portion of the doctor roll 2 is corrected on the basis of the offset data for the doctor roll 2 stored in the memory 50a. Thus, the outer peripheral surfaces of the rolls 1 and 2 are brought into contact with each other while defining no clearance between left and right end portions thereof.

Simultaneously with the movement of the doctor roll 2, the coating roll 1 is moved from the reference position $P_0$ as shown in FIG. 6(a) to the position $P_2$ as shown in FIG. 6(c) at the same step S20. In this case, the intersurface distance $h_3$ between the coating roll 1 and the back-up roll 3 is determined as follows: Assuming that $t_0$ represents the board thickness of the substrate 10 passing through the rolls 1 and 3 and $t_1$ represents the film thickness of the coating solution coated on the surface of the substrate 10, the intersurface distance $h_3$ is obtained by:

$$h_3 = c_1(t_0 + t_1)$$

where $c_1$ represents a constant determined by the elastic modulus of the coating roll 1 etc., which constant is smaller than "1" in general. Also in this movement of the coating roll 1, the amount of movement of the operation side end portion thereof is offset-corrected. In the case of FIG. 7(a) or 7(b) for example, movement of the coating roll 1 is so controlled that the operation side end portion thereof is moved to be lower by the clearance size $\Delta h_1$ or $\Delta h_2$ than the opposite side end portion. Thus, the opposite outer peripheral surfaces of the rolls 1 and 3 are adjusted to be parallel with each other.

Figure 8C:
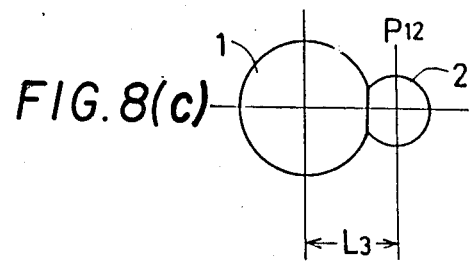

Then the process is advanced to a step S21. If the coating solution flow sensor 38 detects the flow of the coating solution 60 at this step, a timer is set (time $T_1$) at a step S22. After a lapse of the time $T_1$ is detected at step S23, in which a required volume of the coating solution 60 is filled in a depression between the coating roll 1 and the doctor roll 2 provided entirely along the longitudinal direction of the rolls, the process is advanced to a step S24, at which the doctor roll 2 is pushed against the coating roll 1 by a required amount $(L_2 - L_3)$ as shown in FIG. 8(c). Simultaneously with this, the rotation driving means 16 and 42 (FIG. 2) drive the coating roll 1 and the back-up roll 3 to rotate the same at required high speeds (step S24). Thus, the doctor roll 2 also starts high-speed rotation in a coupled manner with the rotation of the coating roll 1, whereby the coating solution 60 is supplied on the entire surfaces of the rolls 1 and 2. The coating solution 60 works as a lubricant in the contact portion between the coating roll 1 and the doctor roll 2. Namely, attrition caused by pushing the coating roll 1 to the doctor roll 2 is reduced by the coating solution 60, whereby abrasion of the coating roll 1 and the doctor roll 2 is prevented.

The doctor roll 2 is pushed against the coating roll 1 for a prescribed time $T_2$ as shown at steps S25 and S26, for the following reason: As shown in FIG. 9, the coating roll 1 is provided on its surface with circumferentially extending grooves having extremely small width 61 at regular pitches in the direction of the roll axis. In order to uniformly supply the coating solution 60 to the grooves 61, an extremely long time is required for uniform supply if the doctor roll 2 is not pushed against the coating roll 1. When, on the other hand, the rolls 1 and 2 are rotated at high speeds while pushing the doctor roll 2 against the coating roll 1, the grooves 61 repeat compression and restoration, whereby the coating solution 60 can be uniformly supplied to the grooves 61 in a relatively short time (the prescribed time $T_2$).

Figure 8D:
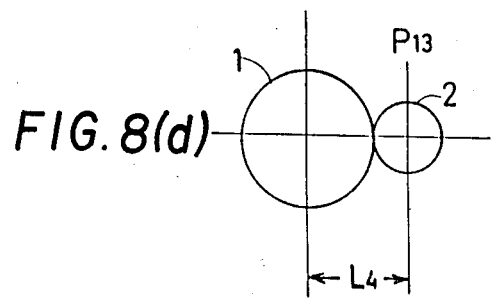
Figure 10:
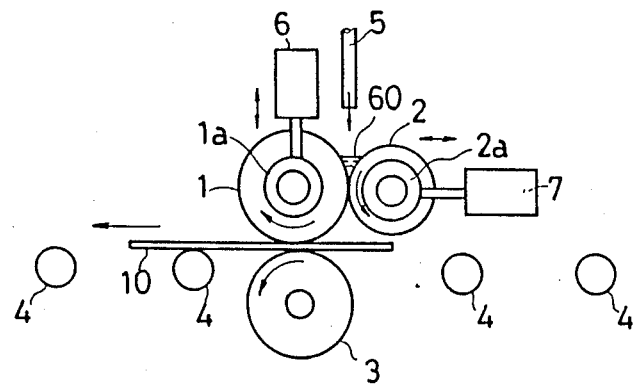
FIG. 10 is a schematic diagram showing a conventional roll coater.
Figure 11:
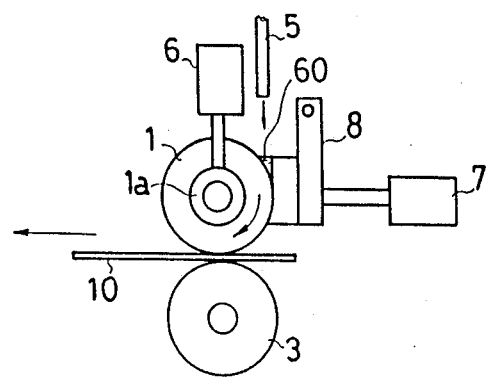
FIG. 11 is a schematic diagram showing another conventional roll coater.

After a lapse of the said time $T_2$, the process is advanced to a step S27, at which the doctor roll 2 is moved to a set position $P_{13}$ (see FIG. 8(d)) determined by the film thickness $t_1$ of the coating film formed on the substrate surface. Also in this movement, the movement of the operation side end portion of the doctor roll 2 is offset-corrected so that the amounts of pushing of, or pressure applied to, the doctor roll 2 against the coating roll 1 are identical on both end portions of the doctor roll 2.

Then, the process is advanced to a step S28, at which the speeds of rotation of the back-up roll 3 and the carrier roll 4 by the driving means 42 are set at prescribed values required for carrying the substrate 10. Further, the speed of rotation of the coating roll 1 by the driving means 16 is switched from the high speed to the normal speed.

Thus, preparation for coating is completed. Thereafter the operator feeds the required substrate 10 between the rolls 1 and 3 from the carrier roll 4, to form the coating film of the required film thickness $t_1$ on the surface of the substrate 10.

(3) Automatic Correction of Roll Position

When, in the roll coater according to the present invention, the coating roll 1 or the doctor roll 2 is displaced from the set position during the aforementioned coating operation, the displaced roll position is automatically corrected to the original position. Namely, upon completion of preparation for coating to enter a coating step, the process is advanced to a step S29 to perform a subroutine for automatic correction of the roll position.

This subroutine is repeatedly executed until data change is performed at a step S30 or mode change is performed at a step S31.

FIG. 4(b) is a flow chart showing the content of the aforementioned subroutine. First, a constant time $T_6$ (or $T_6=0$ as the case may be) is set at a timer at a step S32. After a lapse of the time $T_6$, the process is advanced to a step S34, at which position detecting means 15, 15', 25 and 25' detect the current positions of single ends of the respective rolls 1 and 2. The said current positions are compared with the set positions at a step S35. When the current positions correspond to the set positions in the said comparison, no further positional correction is required and a determination of yes is made at the step S35 to complete the subroutine processing. When the current positions are displaced from the set positions, on the other hand, driving means 13, 13', 23 and 23' perform positional corrections as shown at steps S36 and S37 so that the end positions of the rolls correspond to the set positions.

The subroutine is performed for each end portion of the rolls 1 and 2.

When the displacement continues to exceed a prescribed time, an alarm may be given if necessary.

As a matter of course, the aforementioned offset correction is also performed in the step of automatically correcting the roll positions.

(4) Change in Set Value

When the film thickness $t_1$ of the coating solution 60 coated on the surface of the substrate 10 or the board thickness $t_0$ of the substrate 10 is changed during the coating operation, a data change command is provided at the step S30 as shown in FIG. 4(a), to input data such as new film thickness $t_1$ or new board thickness $t_0$ to be changed in the control part 50 from the operation panel S (FIG. 2). Upon input of such change data, the control part 50 performs arithmetic operations on the positions of the respective rolls 1 and 2 required for realizing the inputted film thickness $t_1$ or board thickness $t_0$, the carrier speed, the discharge of the detergent solution pump 36 and the like. Then, data change processing as shown in FIG. 4(c) is executed in response to the result of arithmetic.

When the position of the doctor roll 2 must be changed in relation to change in the film thickness $t_1$, a determination of yes is made at a step S38, whereby processing is executed from a step S39 to a step S41. This processing is similar to that in the steps S24 to S28 in the coating preparation stage (FIG. 4(a)). Namely, the amount of pushing of the doctor roll 2 and the number of rotation of the coating roll 1 are increased to set the timer (time $T_2'$). After a lapse of the set time $T_2'$, the doctor roll 2 is moved to a new set position. Thereafter the speeds of rotation of the respective rolls 1, 3 and 4 are set at required carrier speeds. Needless to say, the offset correction is also performed in movement of the doctor roll 2.

When the position of the coating roll 1 must be changed in relation to a change in the board thickness $t_0$ of the substrate 10, a determination of yes is made at a step S42, whereby the coating roll 1 is moved to a new set position at a step S43. Also in movement of the coating roll 1, the offset correction is performed, as a matter of course.

When the carrier speed must be changed in relation to a change in the film thickness $t_1$, a determination of yes is made at a step S44, so that the speeds of rotation of the respective rolls 1, 3 and 4 are changed to attain a prescribed carrier speed at a step S45. Further, when the volume of the coating solution must be changed, a determination of yes is made at a step S46, whereby the discharge of the coating solution pump 36 is adjusted at a step S47.

Upon completion of the change processing at the steps S41, S43, S45 and S47, the process is returned to the step S29 as shown in FIG. 4(a) through a step S48.

(5) Roll Cleaning

When the entire substrate 10 is completely coated, the mode is changed to "cleaning" at the step S31 as shown in FIG. 4(a). FIG. 5 is a flow chart showing the procedures of cleaning processing. As obvious from FIG. 5, the change to the cleaning mode is performed by turning a cleaning button on at a step S49. At a step S50, the coating solution pump 36 is stopped and rotation of the rolls 1, 3 and 4 is stopped. Thereafter the detergent solution pump 31 is turned on at a step S51, whereby the detergent solution is supplied from the vessel 30 to the nozzle 34 through the filter 32.

Then, the doctor roll 2 is moved from a position $P_{13}$ in FIG. 8(d) to a position $P_{11}$ in FIG. 8(b) at a step S52. The coating roll 1 is also moved to an appropriate position separated from the back-up roll 3. Also in this case, the offset correction is performed in movement of the rolls 1 and 2, as a matter of course.

Thereafter the detergent solution flow sensor 33 detects flow of the detergent solution 62 at a step S53, whereby the timer (time $T_3$) is set at a step S54. After a lapse of the time $T_3$ to collection of the detergent solution 62 in the depression between the coating roll 1 and the doctor roll 2, the process is advanced from a step S55 to a step S56. At the step S56, the coating roll 1 and the back-up roll 3 start rotation, while the doctor roll 2 also starts rotation in a coupled manner with the rotation of the coating roll 2. The detergent solution nozzle 34 starts swinging along the longitudinal direction of the rolls, to start cleaning the respective rolls 1, 2 and 3. When such cleaning is executed by a time $T_4$ set at the timer as shown at steps S57 and S58, the process is advanced to a step S59, so that the respective rolls 1 and 2 are returned to the reference positions as shown in FIGS. 6(a) and 8(a). Thereafter the detergent solution pump 31 is stopped at a step S60. Then, the timer is set (to a time $T_5$) at a step S61, to complete the cleaning step after a lapse of the time $T_5$ required for drying as shown at a step S62.

Although the roll cleaning step is performed after the coating step in the aforementioned embodiment, the said steps may be replaced in sequence.

According to the embodiment as hereinabove described, the amounts of movement of the rolls are corrected on the basis of the previously obtained offset data, whereby the opposite outer peripheral surfaces of the rolls 1 and 3 and the rolls 1 and 2 are continuously retained parallel in arbitrary positions of movement, thereby to form the coating solution film of uniform thickness on the surface of the substrate 10.

Further, the driving means 13, 13', 23 and 23' formed by pulse motors or the like are employed for driving contact/separation of the rolls 1 and 2 while the position detecting means 15, 15', 25 and 25' formed by linear encoders or the like are employed as means for detecting roll positions, whereby the film thickness can be finely adjusted while enabling automatic adjustment of the film thickness.

In the aforementioned embodiment, the coating roll 1 is driven to be in contact with/separated from the back-up roll 3 while the doctor roll 2 is driven to be in contact with/separated from the coating roll 1. However, the back-up roll 3 may be driven to be in contact with/separated from the coating roll 1 and the coating roll 1 may be driven to be in contact with/separated from the doctor roll 2 to the contrary. Alternatively, both of the rolls 1 and 3 or 1 and 2 may be relatively driven to be in contact with/separated from each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of controlling a roll coater having a doctor roll and a back-up roll relatively movably arranged to be in contact with/separated from a coating roll, said method comprising:

a step of relatively driving said doctor or back-up roll to be close to said coating roll and bringing an end of said coating roll in contact with an end of said doctor or back-up roll at one end side to measure the size of a clearance defined on the other end side:

a step of storing data on said measured clearance size; and a step of controlling the amount of movement in relative driving of said doctor or back-up roll to be in contact with/separated from said coating roll so that the other end side of the roll is moved by a distance larger by said clearance size than the one end side of the roll in a prescribed direction on the basis of said data of said clearance size stored in said memory.

2. A method of controlling a roll coater in accordance with claim 1, further including a step of, when said doctor roll is displaced from an original set position by correcting movement determined by said clearance size in a coating operation, detecting said displacement for correcting movement of said doctor roll to the original set position.

3. A roll coater having doctor and back-up rolls relatively movably arranged to be in contact with/separated from a coating roll, said roll coater comprising:

contact/separation driving means for relatively driving said doctor and back-up rolls to be in contact with/separated from said coating roll;

movement amount detecting means for separately detecting amount of relative movement between both ends of said coating roll and both ends of said doctor or back-up roll;

memory means for storing data of the size of a clearance defined on a second end side of said doctor or back-up roll when a first end of said coating roll is brought into contact with a first end of said doctor or back-up roll; and control means for controlling the amount of movement in relative driving of said doctor or back-up roll to be in contact with/separated from said coating roll through said contact/separation driving means so that the second end side of said doctor or back-up roll is moved in the contact direction by a distance larger by said clearance size than the first end side on the basis of said clearance size data stored in said memory means.

4. A roll coater in accordance with claim 3, wherein said contact/separation driving means includes pulse motors, and said movement amount detecting means are formed by linear encoders.

* * * * *